United States Patent
Chen

(10) Patent No.: US 7,778,365 B2
(45) Date of Patent: Aug. 17, 2010

(54) SATELLITE TWTA ON-LINE NON-LINEARITY MEASUREMENT

(75) Inventor: Ernest C. Chen, San Pedro, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 1889 days.

(21) Appl. No.: 10/165,710

(22) Filed: Jun. 7, 2002

(65) Prior Publication Data

US 2002/0158619 A1    Oct. 31, 2002

Related U.S. Application Data

(63) Continuation-in-part of application No. 09/844,401, filed on Apr. 27, 2001.

(51) Int. Cl.
*H03D 1/04* (2006.01)
*H03K 5/01* (2006.01)
*H04L 1/00* (2006.01)
*H04L 25/08* (2006.01)

(52) U.S. Cl. ........................... 375/346; 375/329

(58) Field of Classification Search ............... 375/229, 375/329, 346
See application file for complete search history.

(56) References Cited

U.S. PATENT DOCUMENTS

| | | | |
|---|---|---|---|
| 3,076,180 A | 1/1963 | Havens et al. | |
| 3,383,598 A | 5/1968 | Sanders | |
| 4,039,961 A | 8/1977 | Ishio et al. | |
| 4,422,175 A | 12/1983 | Bingham et al. | |
| 4,484,337 A | 11/1984 | Leclert et al. | |
| 4,637,017 A | 1/1987 | Assal et al. | |
| 4,654,863 A | 3/1987 | Belfield et al. | |
| 4,829,543 A | 5/1989 | Borth et al. | |
| 4,860,315 A | 8/1989 | Hosoda et al. | |
| 4,992,747 A | 2/1991 | Myers | |
| 5,043,734 A | 8/1991 | Niho | |
| 5,121,414 A * | 6/1992 | Levine et al. | 375/343 |
| 5,206,886 A | 4/1993 | Bingham | |
| 5,206,889 A | 4/1993 | Unkrich | |
| 5,229,765 A | 7/1993 | Gardner | |
| 5,237,292 A | 8/1993 | Chethik | |

(Continued)

FOREIGN PATENT DOCUMENTS

CA        2442400        11/2002

(Continued)

OTHER PUBLICATIONS

The Authoritative Dictionary of IEEE Standards Terms, Seventh Edition, pp. 1047.*

(Continued)

*Primary Examiner*—Chieh M. Fan
*Assistant Examiner*—Freshteh N Aghdam

(57) ABSTRACT

The present invention discloses methods and systems of measuring transmission performance characteristics, such as from an amplifier. The method comprises the steps of receiving a signal, demodulating the signal, generating an ideal signal from the demodulated signal and estimating the performance characteristic from a difference between the ideal signal and the received signal. A system for measuring a transmission performance characteristic, comprises a demodulator for demodulating a received signal, a signal generator for producing an ideal signal from the demodulated signal and a processor for estimating the performance characteristic from a difference between the ideal signal and the received signal.

36 Claims, 17 Drawing Sheets

U.S. PATENT DOCUMENTS

| | | | |
|---|---|---|---|
| 5,285,474 A | 2/1994 | Chow et al. | |
| 5,285,480 A | 2/1994 | Chennakeshu et al. | |
| 5,329,311 A | 7/1994 | Ward et al. | |
| 5,337,014 A | 8/1994 | Najle et al. | |
| 5,353,307 A | 10/1994 | Lester et al. | |
| 5,412,325 A | 5/1995 | Meyers | |
| 5,430,770 A | 7/1995 | Abbey | |
| 5,450,623 A | 9/1995 | Yokoyama et al. | |
| 5,471,508 A | 11/1995 | Koslov | |
| 5,513,215 A | 4/1996 | Marchetto et al. | |
| 5,577,087 A | 11/1996 | Furuya | |
| 5,579,344 A * | 11/1996 | Namekata | 375/341 |
| 5,581,229 A | 12/1996 | Hunt et al. | |
| 5,602,868 A | 2/1997 | Wilson | |
| 5,608,331 A | 3/1997 | Newberg et al. | |
| 5,648,955 A | 7/1997 | Jensen et al. | |
| 5,671,253 A | 9/1997 | Stewart | |
| 5,732,113 A | 3/1998 | Schmidl et al. | |
| 5,793,818 A | 8/1998 | Claydon et al. | |
| 5,799,010 A | 8/1998 | Lomp et al. | |
| 5,815,531 A | 9/1998 | Dent | |
| 5,819,157 A | 10/1998 | Ben-Efraim et al. | |
| 5,870,439 A | 2/1999 | Ben-Efraim et al. | |
| 5,903,546 A | 5/1999 | Ikeda et al. | |
| 5,909,454 A | 6/1999 | Schmidt | |
| 5,937,004 A | 8/1999 | Fasulo et al. | |
| 5,940,025 A | 8/1999 | Koehnke et al. | |
| 5,940,750 A | 8/1999 | Wang | |
| 5,952,834 A | 9/1999 | Buckley | |
| 5,960,040 A | 9/1999 | Cai et al. | |
| 5,966,186 A | 10/1999 | Shigihara et al. | |
| 5,966,412 A | 10/1999 | Ramaswamy | |
| 5,970,156 A | 10/1999 | Hummelgaard et al. | |
| 5,970,429 A | 10/1999 | Martin | |
| 5,978,652 A | 11/1999 | Burr et al. | |
| 5,987,068 A | 11/1999 | Cassia et al. | |
| 5,999,793 A | 12/1999 | Ben-Efraim et al. | |
| 6,002,713 A | 12/1999 | Goldstein et al. | |
| 6,028,894 A | 2/2000 | Oishi et al. | |
| 6,032,026 A | 2/2000 | Seki et al. | |
| 6,034,952 A | 3/2000 | Dohi et al. | |
| 6,049,566 A | 4/2000 | Saunders et al. | |
| 6,055,278 A * | 4/2000 | Ho et al. | 375/296 |
| 6,072,841 A | 6/2000 | Rahnema | |
| 6,075,808 A | 6/2000 | Tsujimoto | |
| 6,078,645 A | 6/2000 | Cai et al. | |
| 6,104,747 A | 8/2000 | Jalloul et al. | |
| 6,108,374 A | 8/2000 | Balachandran et al. | |
| 6,125,148 A | 9/2000 | Frodigh et al. | |
| 6,125,260 A | 9/2000 | Wiedeman et al. | |
| 6,134,282 A | 10/2000 | Ben-Efraim et al. | |
| 6,140,809 A | 10/2000 | Doi | |
| 6,144,708 A * | 11/2000 | Maruyama | 375/327 |
| 6,192,088 B1 | 2/2001 | Aman et al. | |
| 6,219,095 B1 | 4/2001 | Zhang et al. | |
| 6,177,836 B1 | 6/2001 | Young et al. | |
| 6,246,717 B1 | 6/2001 | Chen et al. | |
| 6,275,678 B1 | 8/2001 | Bethscheider et al. | |
| 6,297,691 B1 | 10/2001 | Anderson et al. | |
| 6,313,885 B1 | 11/2001 | Patel et al. | |
| 6,314,441 B1 | 11/2001 | Raghunath | |
| 6,320,464 B1 | 11/2001 | Suzuki et al. | |
| 6,330,336 B1 * | 12/2001 | Kasama | 381/71.1 |
| 6,333,924 B1 | 12/2001 | Porcelli et al. | |
| 6,335,951 B1 | 1/2002 | Cangiani et al. | |
| 6,369,648 B1 | 4/2002 | Kirkman | |
| 6,377,116 B1 | 4/2002 | Mattsson et al. | |
| 6,404,819 B1 | 6/2002 | Gehlot | |
| 6,411,797 B1 * | 6/2002 | Estinto | 455/9 |
| 6,426,822 B1 | 7/2002 | Winter et al. | |
| 6,452,977 B1 | 9/2002 | Goldston et al. | |
| 6,477,398 B1 | 11/2002 | Mills | |
| 6,501,804 B1 | 12/2002 | Rudolph et al. | |
| 6,522,683 B1 | 2/2003 | Smee et al. | |
| 6,529,715 B1 | 3/2003 | Kitko et al. | |
| 6,539,050 B1 | 3/2003 | Lee et al. | |
| 6,556,639 B1 | 4/2003 | Goldston et al. | |
| 6,574,235 B1 | 6/2003 | Arslan et al. | |
| 6,657,978 B1 | 12/2003 | Millman | |
| 6,661,761 B2 | 12/2003 | Hayami et al. | |
| 6,678,336 B1 | 1/2004 | Katoh et al. | |
| 6,700,442 B2 | 3/2004 | Ha | |
| 6,718,184 B1 | 4/2004 | Aiken et al. | |
| 6,731,698 B1 | 5/2004 | Yoshie | |
| 6,731,700 B1 * | 5/2004 | Yakhnich et al. | 375/341 |
| 6,772,182 B1 | 8/2004 | McDonald et al. | |
| 6,795,496 B1 | 9/2004 | Soma et al. | |
| 6,803,814 B1 | 10/2004 | Krupezevic et al. | |
| 6,809,587 B2 | 10/2004 | Ghannouchi et al. | |
| 6,922,436 B1 | 7/2005 | Porat et al. | |
| 6,922,439 B2 | 7/2005 | Yamaguchi et al. | |
| 6,947,741 B2 | 9/2005 | Beech et al. | |
| 6,956,841 B1 | 10/2005 | Stahle et al. | |
| 6,956,924 B2 | 10/2005 | Linsky et al. | |
| 6,970,496 B1 | 11/2005 | Ben-Bassat et al. | |
| 6,980,609 B1 | 12/2005 | Ahn | |
| 6,990,627 B2 | 1/2006 | Uesugi et al. | |
| 6,999,510 B2 | 2/2006 | Batruni | |
| 7,041,406 B2 | 5/2006 | Schuler et al. | |
| 7,073,116 B1 | 7/2006 | Settle et al. | |
| 7,079,585 B1 | 7/2006 | Settle et al. | |
| 7,154,958 B2 | 12/2006 | Dabak et al. | |
| 7,161,931 B1 | 1/2007 | Li et al. | |
| 7,173,981 B1 | 2/2007 | Chen et al. | |
| 7,209,524 B2 | 4/2007 | Chen | |
| 7,230,992 B2 | 6/2007 | Walker et al. | |
| 7,239,876 B2 | 7/2007 | Johnson et al. | |
| 7,263,119 B1 | 8/2007 | Hsu et al. | |
| 2001/0012322 A1 | 8/2001 | Nagaoka et al. | |
| 2001/0055295 A1 | 12/2001 | Akiyama et al. | |
| 2002/0006795 A1 | 1/2002 | Norin et al. | |
| 2002/0009141 A1 | 1/2002 | Yamaguchi et al. | |
| 2002/0010001 A1 | 1/2002 | Dahlman et al. | |
| 2002/0051435 A1 | 5/2002 | Giallorenzi et al. | |
| 2002/0067744 A1 | 6/2002 | Fujii et al. | |
| 2002/0071506 A1 * | 6/2002 | Lindquist et al. | 375/344 |
| 2002/0082792 A1 | 6/2002 | Bourde et al. | |
| 2002/0136327 A1 | 9/2002 | El-Gamal et al. | |
| 2002/0172296 A1 | 11/2002 | Pilcher | |
| 2002/0186761 A1 | 12/2002 | Corbaton et al. | |
| 2003/0002471 A1 | 1/2003 | Crawford et al. | |
| 2003/0043941 A1 | 3/2003 | Johnson et al. | |
| 2003/0072385 A1 | 4/2003 | Dragonetti | |
| 2003/0147472 A1 | 8/2003 | Bach et al. | |
| 2003/0171102 A1 | 9/2003 | Yang | |
| 2003/0185310 A1 | 10/2003 | Ketchum et al. | |
| 2003/0194022 A1 | 10/2003 | Hammons et al. | |
| 2004/0013084 A1 | 1/2004 | Thomas et al. | |
| 2004/0091059 A1 | 5/2004 | Chen | |
| 2004/0137863 A1 | 7/2004 | Walton et al. | |
| 2004/0146014 A1 | 7/2004 | Hammons et al. | |
| 2004/0146296 A1 | 7/2004 | Gerszberg et al. | |
| 2004/0196935 A1 | 10/2004 | Nieto | |
| 2005/0037724 A1 | 2/2005 | Walley et al. | |
| 2006/0013333 A1 | 1/2006 | Chen | |
| 2006/0022747 A1 | 2/2006 | Chen et al. | |
| 2006/0045191 A1 | 3/2006 | Vasanth et al. | |
| 2006/0056541 A1 | 3/2006 | Chen et al. | |
| 2007/0121718 A1 | 5/2007 | Wang et al. | |

FOREIGN PATENT DOCUMENTS

| | | |
|---|---|---|
| CA | 2502924 | 5/2004 |
| EP | 0115218 | 8/1984 |

| | | |
|---|---|---|
| EP | 0222076 | 5/1987 |
| EP | 0 238 822 A2 | 9/1987 |
| EP | 0 356 096 A2 | 2/1990 |
| EP | 0356096 A2 | 2/1990 |
| EP | 0929164 | 7/1999 |
| EP | 1011245 | 6/2000 |
| EP | 1054537 A1 | 11/2000 |
| EP | 1065854 | 1/2001 |
| EP | 1081903 A1 | 3/2001 |
| EP | 1335512 | 8/2003 |
| FR | 2724522 | 3/1996 |
| JP | 2002118611 | 4/2002 |
| KR | 2001 0019997 | 3/2001 |
| TW | 318983 B | 11/1997 |
| TW | 362333 B | 6/1999 |
| TW | 391107 B | 5/2000 |
| TW | 435009 B | 5/2001 |
| TW | 451569 B | 8/2001 |
| TW | 462168 B | 11/2001 |
| TW | 499800 B | 8/2002 |
| TW | 502506 B | 9/2002 |
| WO | WO 99/00957 | 1/1999 |
| WO | WO 99/20001 | 4/1999 |
| WO | WO 99/23718 | 5/1999 |
| WO | WO 00/79708 A1 | 12/2000 |
| WO | WO 01/19013 | 3/2001 |
| WO | WO 01/39455 | 5/2001 |
| WO | WO 01/39456 | 5/2001 |
| WO | WO 01/80471 A2 | 10/2001 |
| WO | WO 02/073817 | 9/2002 |
| WO | WO 03/105375 | 12/2003 |
| WO | WO 2005/074171 | 8/2005 |
| WO | WO 2005/086444 | 9/2005 |

OTHER PUBLICATIONS

The Authoritative Dictionary of IEEE Standards Terms Seventh Edition, p. 1047, Jan. 1, 2000.*

Ramchandran, Kannan et al., *Multiresolution Broadcast for Digital HDTV Using Joint Source/Channel Coding*, IEEE, vol. 11, No. 1, Jan. 1993, pp. 6-22.

Ted J. Wolcott et al., *Uplink-Noise Limited Satellite Channels*, IEEE, 1995, pp. 717-721.

Janssen G J M; Slimane S B: "Performance of a Multiuser Detector for M-PSK Signals Based on Successive Cancellation", ICC 2001, 2001 IEEE International Conference on Communications, Conference Record, Helsinky, Finland, Jun. 11-14, 2001, XP010552960.

Slimane S B; Janssen G J M: "Power Optimization of M-PSK Cochannel Signals for a Narrowband Multiuser Detector", 2001 IEEE Pacific Rim Conference on Communications, Computer and Signal Processing, Victoria BC, Canada, Aug. 26-28, 2001, XP010560334.

Soong, A C K; Krzymien W A: "Performance of a Reference Symbol Assisted Multistage Successive Interference Cancelling Receiver in a Multicell CDMA Wireless System", Conference Record, Communication Theory Mini-Conference GlobeCom '95, IEEE Singapore Nov. 13-17, 1995, XP010159490.

Arslan H; Molnar K: "Iterative Co-channel Interference Cancellation in Narrowband Mobile Radio Systems", Emerging Technologies Symposium: Broadband, Wireless Internet Access, 2000 IEEE Apr. 10-11, 2000, Piscataway, New Jersey, USA, XP010538900.

Meyr, Heinrich et al.; "Digital Communication Receivers: Synchronization, Channel Estimation, and Signal Processing"; 1998; John Wiley & Sons, pp. 212-213, 217-218, XP002364874.

Meyr, Heinrich et al.; "Digital Communication Receivers: Synchronization, Channel Estimation, and Signal Processing"; 1998; John Wiley & Sons, pp. 610-612, XP002364876.

Patent Abstracts of Japan; vol. 015, No. 355 (E-1109): JP 03139027; Nippon Telegraph and Telephone Corporation; Publication date: Jun. 13, 1991.

Chen, Ernest et al.; "DVB-S2 Backward-Compatible Modes: A Bridge Between the Present and the Future"; International Journal of Satellite Communications and Networking; vol. 22, Issue 3, pp. 341-365; published 2004 by John Wiley & Sons, Ltd.

Palicot, J., Veillard, J.; "Possible Coding and Modulation Approaches to Improve Service Availability for Digital HDTV Satellite Broadcasting at 22 GHz"; IEEE Transactions on Consumer Electronics; vol. 39, Issue 3; Aug. 1993; pp. 660-667.

U.S. Appl. No. 10/693,135, filed Oct. 24, 2003, Chen.

U.S. Appl. No. 10/532,632, filed Apr. 25, 2003, Chen et al.

ROC (Taiwan) Search Report dated Apr. 3, 2009 in ROC (Taiwan) Patent Application No. 092129498 filed Oct. 24, 2003 by Ernest C. Chen et al., received by Applicants on Aug. 11, 2009.

ROC (Taiwan) Search Report dated Apr. 3, 2009 in ROC (Taiwan) Patent Application No. 092117948 filed Jul. 1, 2003 by Ernest C. Chen et al., received by Applicants on Aug. 11, 2009.

Canadian Office Action dated Sep. 17, 2009 in Canadian Patent Application No. 2503432 filed Oct. 20, 2003 by Paul R. Anderson et al.

EPO Summons to attend oral proceedings dated Sep. 16, 2009 in European Patent Application No. 03757359.9 filed Jun. 5, 2003 by Ernest C. Chen.

Notice of Allowance dated Sep. 6, 2007 in U.S. Appl. No. 10/692,491 filed Oct. 24, 2003 by Ernest C. Chen.

Notice of Allowance dated Aug. 29, 007 in U.S. Appl. No. 11/603,776 filed Nov. 22, 2006 by Ernest C. Chen et al.

Notice of Allowance dated Sep. 15, 2009 in U.S. Appl. No. 10/519,375 filed Jul. 3, 2003 by Ernest C. Chen et al.

Notice of Allowance dated Sep. 4, 2009 in U.S. Appl. No. 12/329,456 filed Dec. 5, 2008 by Ernest C. Chen et al.

Notice of Allowance dated Jul. 13, 2009 in U.S. Appl. No. 10/913,927 filed Aug. 5, 2004 by Ernest C. Chen.

Canadian Office action dated May 7, 2009 in Canadian Application No. 2495855 filed Aug. 26, 2003 by Ernest C. Chen et al.

Arslan, Huseyin and Molnar, Karl; "Co-channel Interference Cancellation with Successive Cancellation in Narrowband TDMA Systems"; Wireless Communications and Networking Conference; 2000 IEEE; Sep. 23-28, 2000; Piscataway, New Jersey, USA; vol. 3; pp. 1070-1074; XP010532692; ISBN: 0-7803-6596-8.

Non-final Office action dated Mar. 3, 2008 in U.S. Appl. No. 11/656,662 filed Jan. 22, 2007 by Ernest C. Chen et al.

Scott, R. P. et al.; Ultralow Phase Noise Ti:sapphire Laser Rivals 100 MHz Crystal Oscillator; Nov. 11-15, 2001; IEEE-Leos; pp. 1-2.

Combarel, L. et al.; HD-SAT Modems for the Satellite Broadcasting in the 20 GHz Frequency Band; IEEE Transactions on Consumer Electronics; vol. 41, Issue 4; Nov. 1995; pp. 991-999.

EPO Summons to oral proceedings dated Feb. 10, 2010 in European Patent Application No. 03742400.9 filed Jul. 1, 2003 by Ernest C. Chen et al.

EPO Communications dated Feb. 22, 2010 in European Patent Application No. 03742400.9 filed Oct. 16, 2003 by Ernest C. Chen.

Notice of Allowance dated Apr. 7, 2010 in U.S. Appl. No. 10/236,414 filed Sep. 6, 2002 by Ernest C. Chen et al.

* cited by examiner

SATELLITE TWTA ON-LINE NON-LINEARITY MEASUREMENT

CROSS-REFERENCE TO RELATED APPLICATIONS

This is a continuation-in-part application and claims the benefit under 35 U.S.C. Section 120 of the following co-pending and commonly-assigned U.S. utility patent application, which is incorporated by reference herein:

Utility application Ser. No. 09/844,401, filed Apr. 27, 2001, by Ernest C. Chen, entitled "LAYERED MODULATION FOR DIGITAL SIGNALS,".

BACKGROUND OF THE INVENTION

1. Field of the Invention

The present invention relates generally to systems and methods for measuring amplifier performance, and particularly for measuring travelling wave tube amplifier (TWTA) performance in satellite systems.

2. Description of the Related Art

Travelling wave tube amplifiers (TWTA) are a key component for many communication systems. As with many components of communication systems there is a need to monitor and diagnose the operation of the TWTAs in use. There is particularly a need for such techniques in systems which require feedback of TWTA performance characteristics to optimize their operation. Also, TWTA measurements may be useful in communication systems which employ layered modulation, such as described in copending and commonly assigned application Ser. No. 09/844,401, filed on Apr. 27, 2001, by Ernest Chen and entitled "LAYERED MODULATION FOR DIGITAL SIGNALS", which is hereby incorporated by reference herein, are examples of such systems.

Currently measurements of TWTA performance are obtained by shutting down the transponder service and driving the TWTA at varying input power levels, and measuring amplitude and phase responses as a function of input power level. As it is often desirable to maximize the operating time of the transponders in communication systems, techniques which enable measuring performance of the TWTA while it remains operating are very useful.

In such systems, the TWTA characteristics must be measured while the TWTA operates. The present invention meets the described needs.

SUMMARY OF THE INVENTION

The present invention discloses a system and methods of measuring transmission performance characteristics, such as from an amplifier. The method comprises the steps of receiving a signal, demodulating the signal, generating an ideal signal from the demodulated signal and estimating the performance characteristic from a difference between the ideal signal and the received signal. A system for measuring a transmission performance characteristic comprises a demodulator for demodulating a received signal, a signal generator for producing an ideal signal from the demodulated signal and a processor for estimating the performance characteristic from a difference between the ideal signal and the received signal.

The present invention is particularly useful for monitoring TWTA performance. In addition, the invention may be used to diagnose system problems that may be caused by the TWTAs. TWTA linearity performance may be efficiently summarized in two fundamental graphs, an AM-AM curve and an AM-PM curve, which map an input amplitude modulation to an output amplitude modulation and an output phase modulation, respectively. The invention may be used to produce accurate AM-AM and AM-PM curves. Such curves may be used in systems which may employ active feedback of TWTA characteristics, such as in layered modulation transmission schemes.

The invention provides the advantage that it may be performed without taking the TWTA off line. In addition, the present invention may be employed regardless of the signal format, e.g. QPSK, 8PSK, 16QAM, etc. Although the invention is well suited for digital signal formats, it is not limited to these applications. Analog signal formats may require signal sampling and timing synchronization, however. The invention may also be used at anytime and from any place so long as a signal transmitted by the transponder may be captured for processing. In addition, the invention provides very accurate results with errors as small as −50 dB rms for signals with sufficient carrier-to-interference ratio (CIR) and carrier-to-noise ratio (CNR).

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Figure 1:
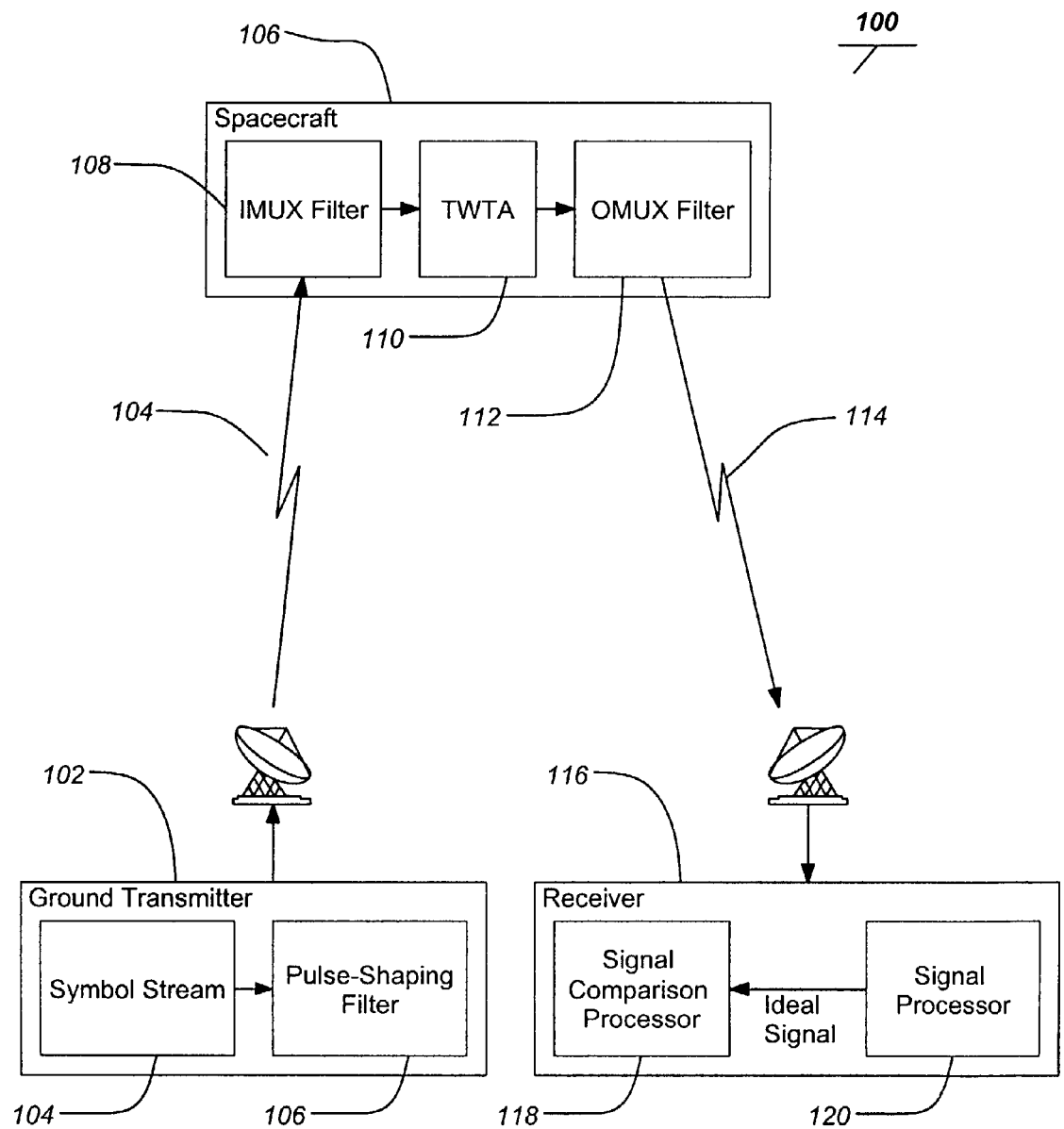
FIG. 1 is a signal path block diagram of an embodiment employing the invention.

FIG. 1 is a simplified signal path block diagram of an embodiment employing the invention. The invention measures and characterizes the difference between a signal 114 received at a receiver 116 and an ideal signal, which may represent the transmitted signal 104. From this difference the influence of intervening hardware and environments may be determined. Estimating performance of a TWTA used in a satellite broadcast system is one example of application which may especially benefit from the present invention.

In the typical system 100 of FIG. 1, a ground transmitter 102 produces a signal which includes a symbol stream 104 that may be processed by a pulse-shaping filter 106. The signal is transmitted through an uplink 104 to a spacecraft 106 or other suitable platform which may include an input multiplexing (IMUX) filter 108 for filtering out undesirable signal components outside the frequency band of interest. A TWTA 110 is then used to amplify the signal. An output multiplexing (OMUX) filter 112 may then cleanse the output signal in the extraneous frequency ranges before it is conveyed through the downlink 114 to a receiver 116.

The receiver 116 which receives the signal includes signal processor 120 which extracts the symbol stream and carrier frequency from the incoming signal and generates an ideal signal, i.e. a signal without the effects of the TWTA and noise. The ideal signal is then used in a comparison processor 118 to produce the TWTA performance maps. The details of the invention concerning the generation of the performance maps will be described below in the discussion of FIGS. 2A-2B.

Typically, the TWTA performance maps will comprise measurements of the output amplitude modulation versus the input amplitude modulation (the AM-AM map) and the output phase modulation versus the input amplitude modulation (the AM-PM map). In the present invention the received signal represents the amplifier output (plus noise) and the generated ideal signal represents the amplifier input. In addition to diagnosing and monitoring the amplifier, these performance maps may then be used to facilitate and/or improve reception of different layers of a system using a layered modulation transmission scheme.

Figure 2A:
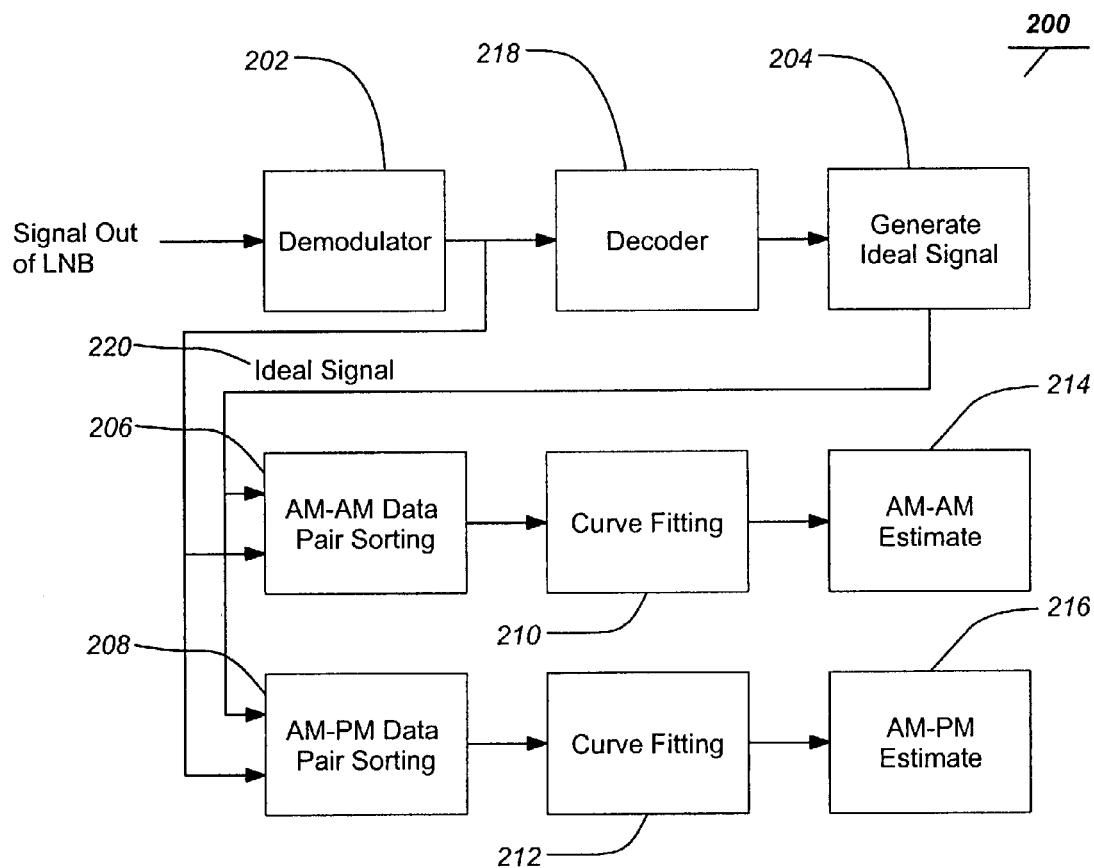
FIGS. 2A-2B are block diagrams of the apparatus and method of the present invention.
Figure 2B:
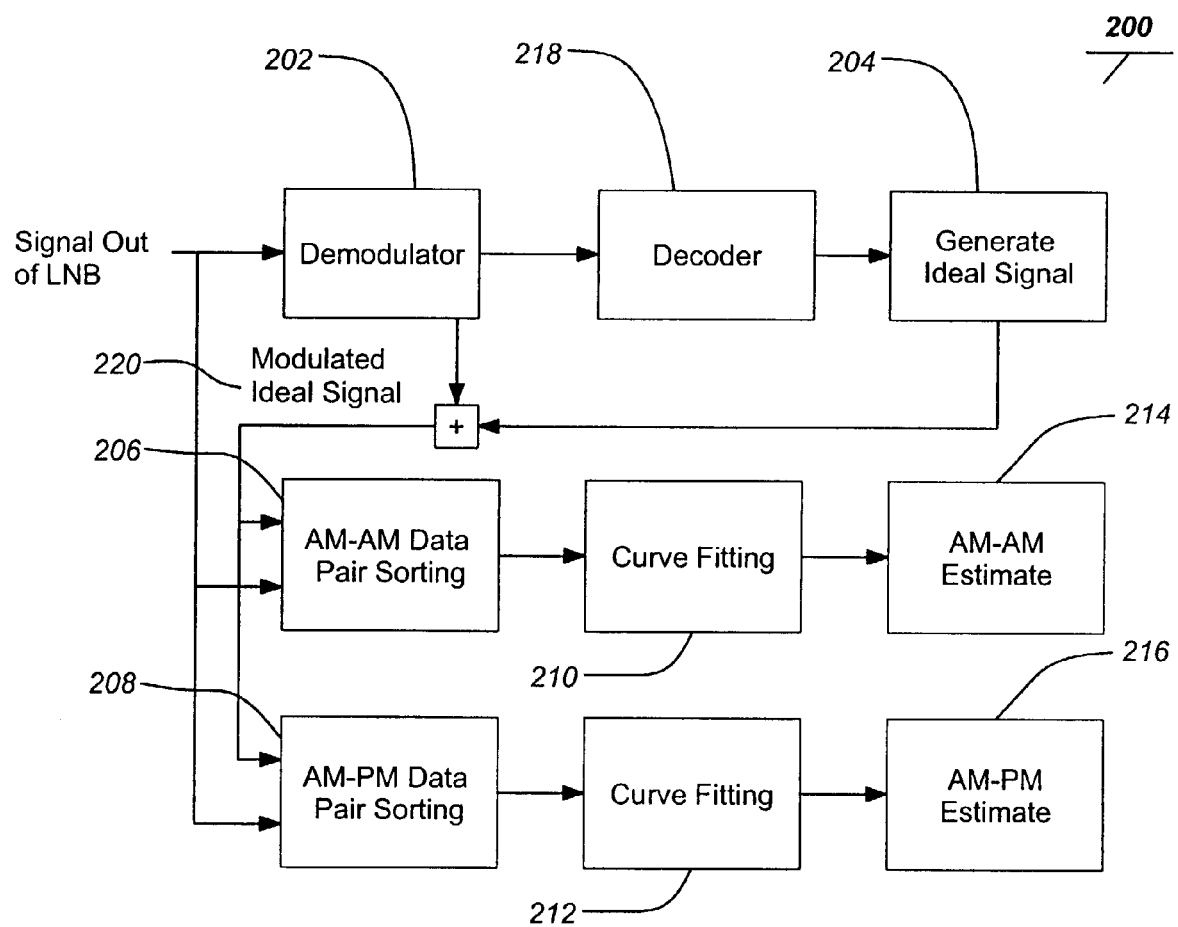

FIGS. 2A and 2B are block diagrams of the basic system of the invention 200. All of the described functions may be carried out within a receiver 116 used in a direct broadcast satellite system having a basic architecture as described in FIG. 1. The appropriate signal section is captured and demodulated by demodulator 202 which aligns symbol timing and removes any residual carrier frequency and phase in the signal. The demodulated signal is used in a signal generator 204 to generate an ideal signal, i.e. one representing the pre-transmitted signal. In the case of a digital signal, the signal will be further decoded to obtain the signal symbols which will be used to generate the ideal signal. The difference between the ideal signal and the received signal is used by processors 206, 210, 208, 212 to estimate a transmission performance characteristic. Only a small section of the received signal, on the order of a few thousand symbols, may be needed to obtain an estimate.

FIG. 2A depicts an embodiment where the performance characteristic is estimated from a difference between the ideal signal (noise-free and without TWTA non-linearity) and the received signal after demodulation. Because the ideal signal is generated from only the symbols and symbol timing, obtaining the estimate from the received signal after demodulation simplifies the processing.

FIG. 2B depicts an embodiment where the performance characteristic is estimated from a difference between the ideal signal and the received signal before demodulation. In this case, the ideal signal must also be generated with the carrier frequency of the received signal. This may be done by adding the demodulated symbol timing and carrier frequency and phase to the ideal signal.

If necessary, forward error correction (FEC) may be applied to the demodulated signal as part of decoding to ensure that all recovered symbols are error-free.

In either embodiment (FIG. 2A or 2B) the ideal signal and the received signal are next used in processors 206, 208 to pair and sort data points of the two signals. These processors 206, 208 characterize a relationship between an input signal and an output signal of the amplifier. In this case, the input signal is represented by the generated ideal signal 220 (modulated or otherwise) and the output signal is represented by the received signal. The X-axis of an AM-AM scattergram plots the magnitudes of the ideal signal samples with perfect TWTA linearity, and the Y-axis consists of the magnitudes of the received signal samples including the TWTA non-linearity (and noise). An AM-PM scattergram is similarly formed. The X-axis is the same as that for the AM-AM scattergram, and the Y-axis consists of all phase differences between the corresponding samples with and without TWTA non-linearity. Finally, the data points of the ideal signal and the corresponding data points of the received signal are processed by a processor 210, 212 to form a line through curve fitting, such as with a polynomial. The curve fitting processor 210, 212 may be separate or part of the processor 206, 208 which paired and sorted the data points. The result is an estimate of the desired performance characteristic of the TWTA 214, 216.

Figure 2C:
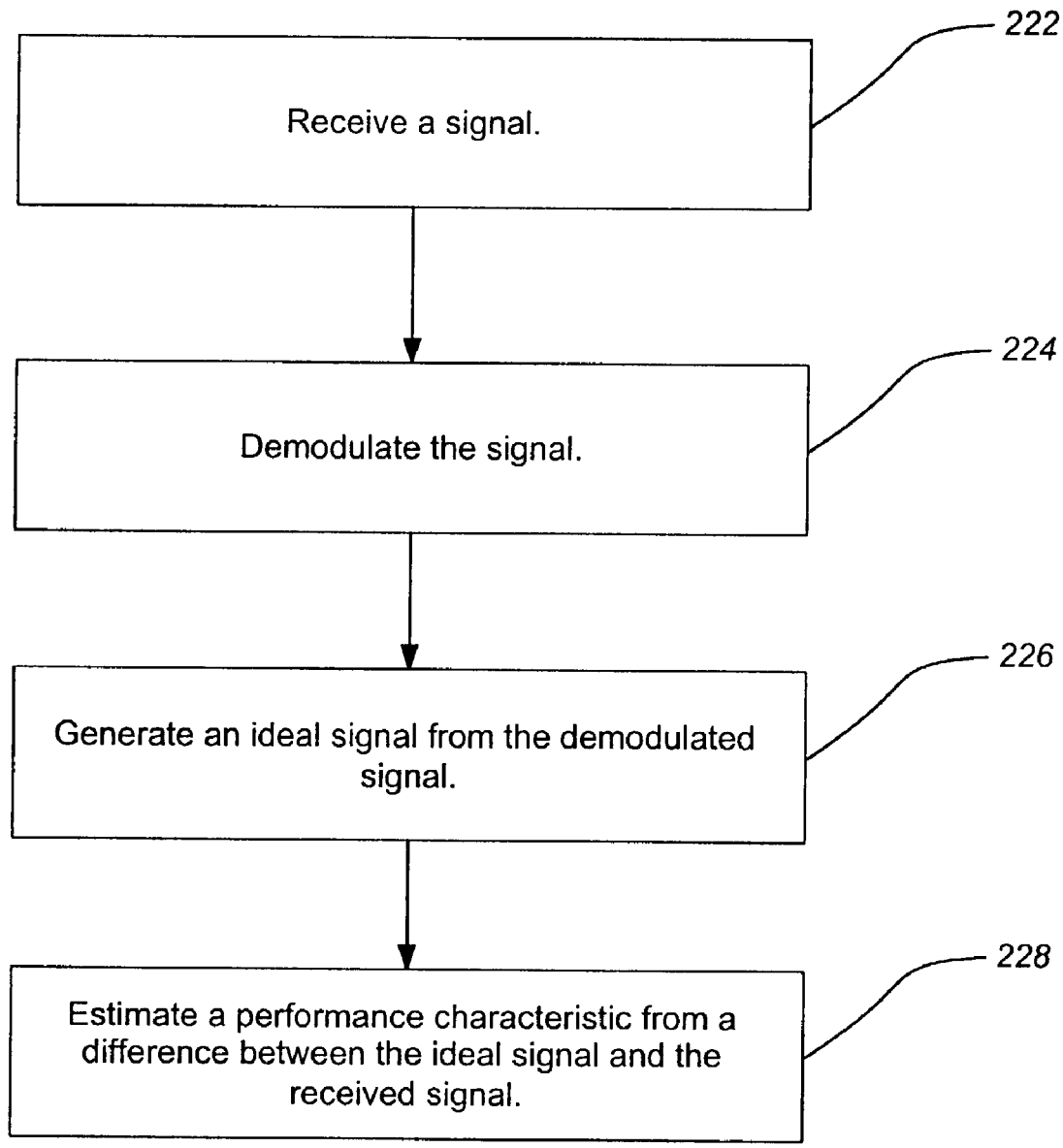
FIG. 2C is a flowchart of the apparatus and method of the present invention

FIG. 2C outlines the flow of a method of the present invention. A signal is received at block 222. The signal is demodulated at block 224. Then an ideal signal is generated from the demodulated signal at block 226. Finally, a performance characteristic is estimated from a difference between the ideal signal and the received signal at block 228. The following examples will illustrate details of the present invention as applied to TWTA performance measurement.

Figure 3:
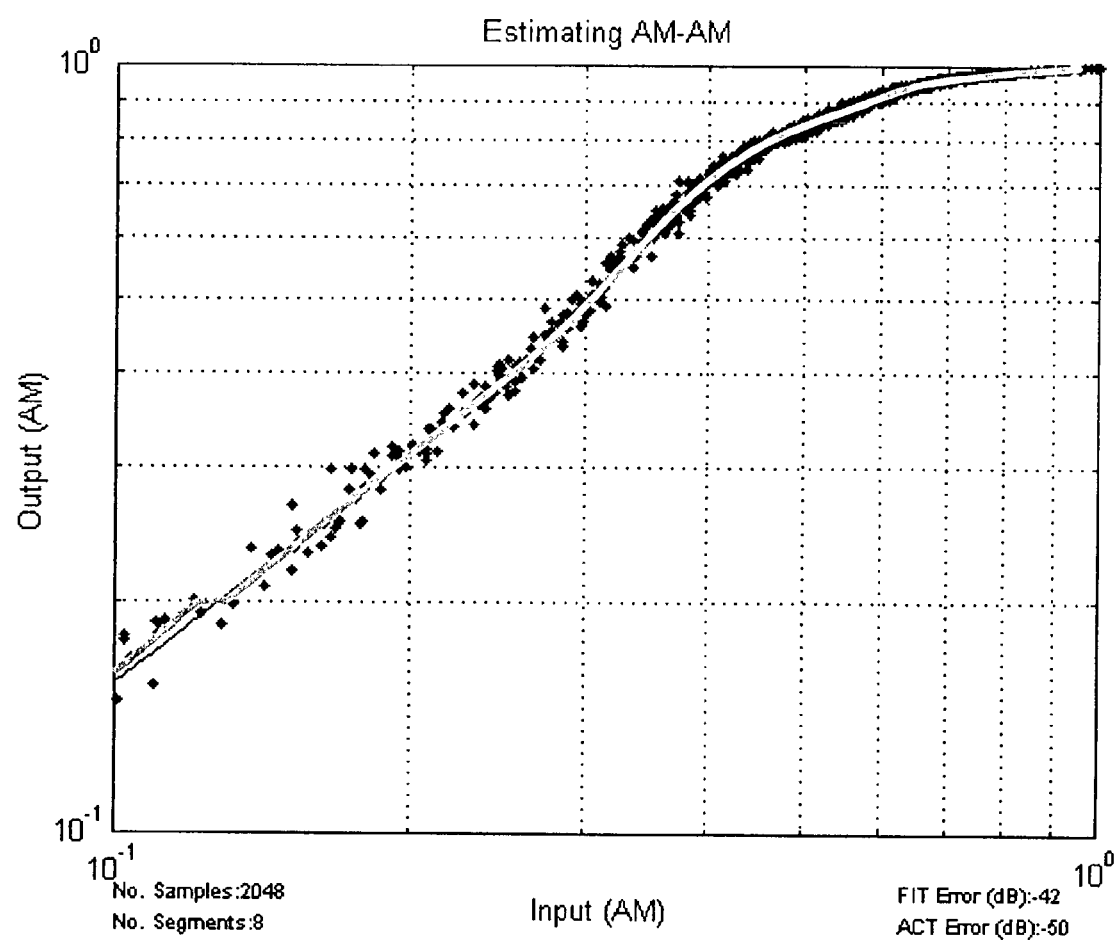
FIG. 3 is an AM-AM scattergram and curve fitting from the signal data with no noise.
Figure 4:
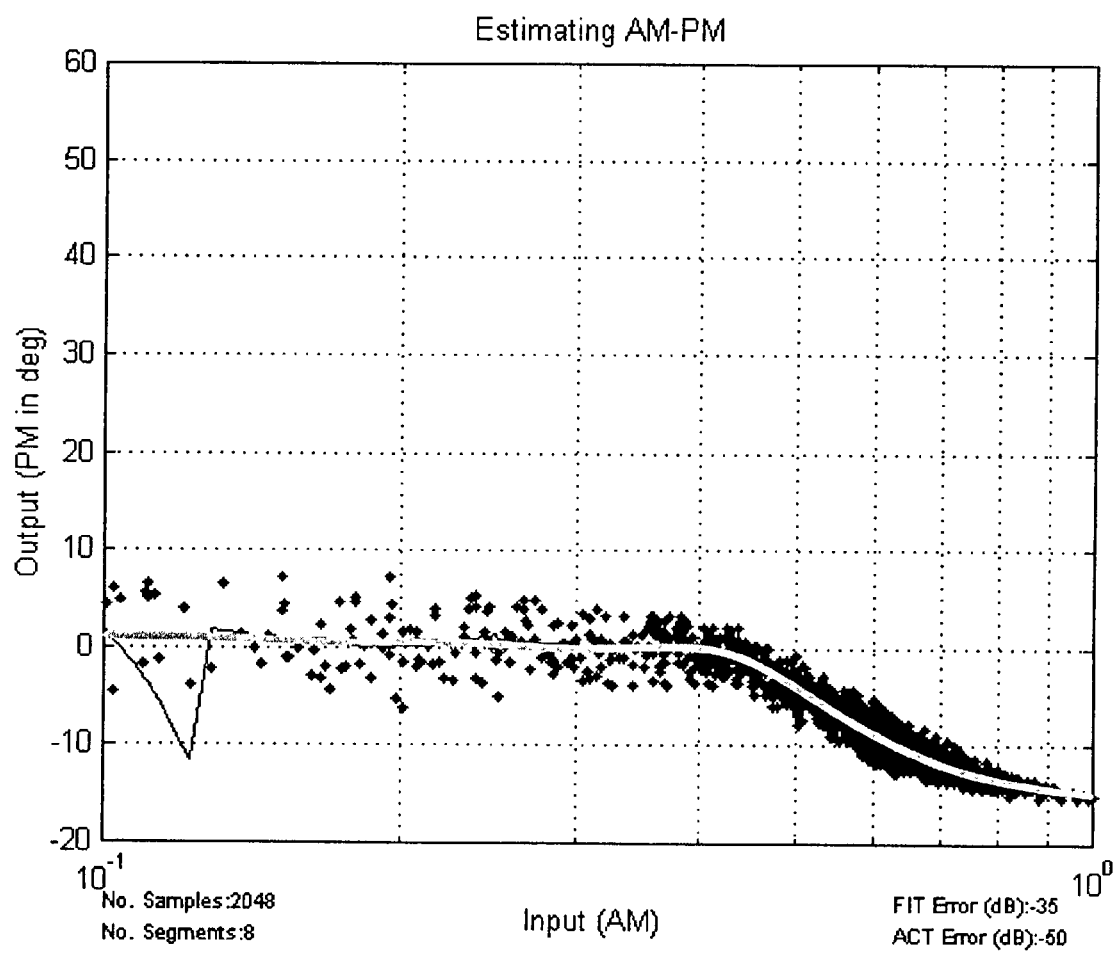
FIG. 4 is an AM-PM scattergram and curve fitting from the signal data with no noise.

FIGS. 3 and 4 show example scattergrams from simulated QPSK signals with no noise in the signal. FIG. 3 is an AM-AM scattergram and FIG. 4 is an AM-PM scattergram. In this case, the sample scattering in the scattergrams is primarily due to the IMUX and OMUX filters which were not included in the reconstruction of the distortion-free signal.

Next, each scattergram is fitted with a curve by a minimum-mean-square (mms) error process. For best fitting performance with low-degree polynomials, the X-axis may be divided into several segments. Curve fitting is performed on each segment, and the fitting polynomials are then pieced together from segment to segment. The concatenated curves form the estimates of the AM-AM and AM-PM maps for the transponder.

As an example, FIG. 3 shows the fitting process for the AM-AM curve with simulated data, when no noise is present in the received signal. The overall fitting error is −42 dB. Likewise, FIG. 4 shows the results of an AM-PM estimate from the same set of received and reconstructed signals. The minimum-mean-square (mms) fitting error is −35 dB in this case. The mms error between the fitting curves and the actual AM-AM and AM-PM curves, which are of importance here, are found to be quite low in these cases, both less than −50 dB.

Figure 5:
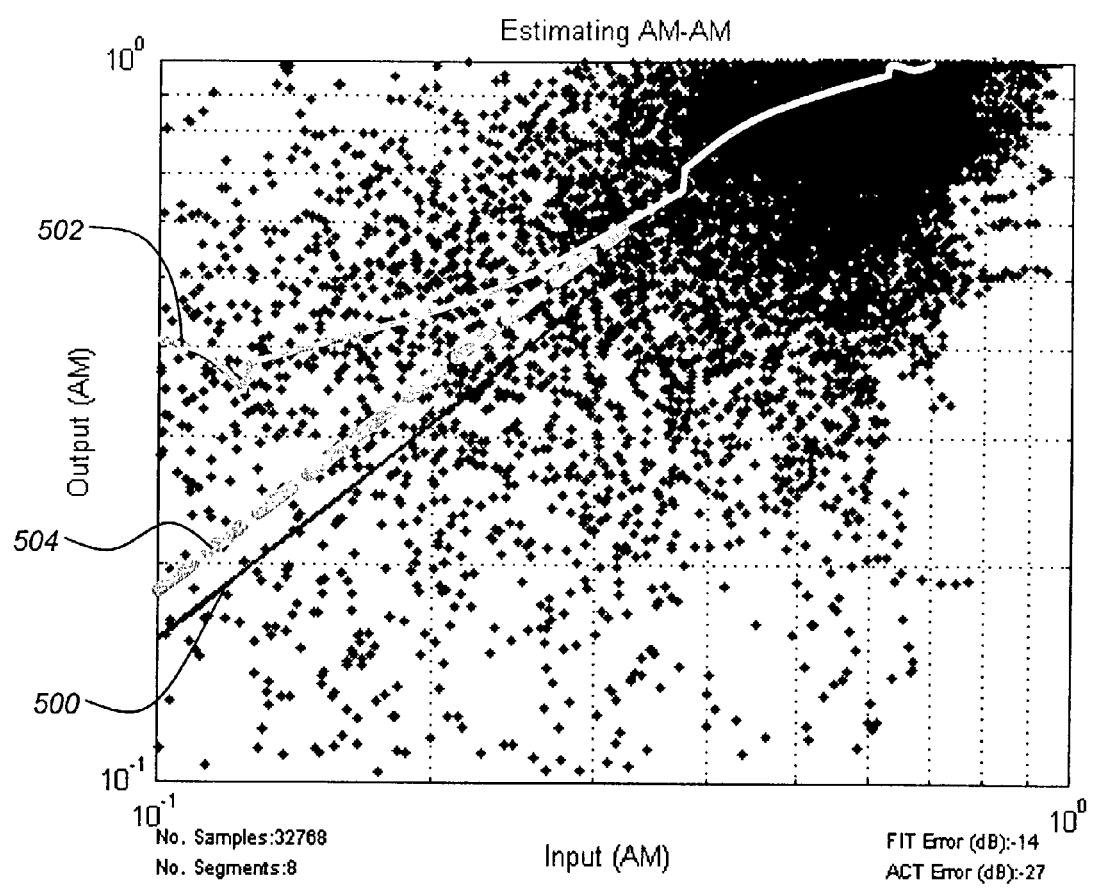
FIG. 5 is an AM-AM scattergram and curve fitting from a signal with 7 dB CNR.
Figure 6:
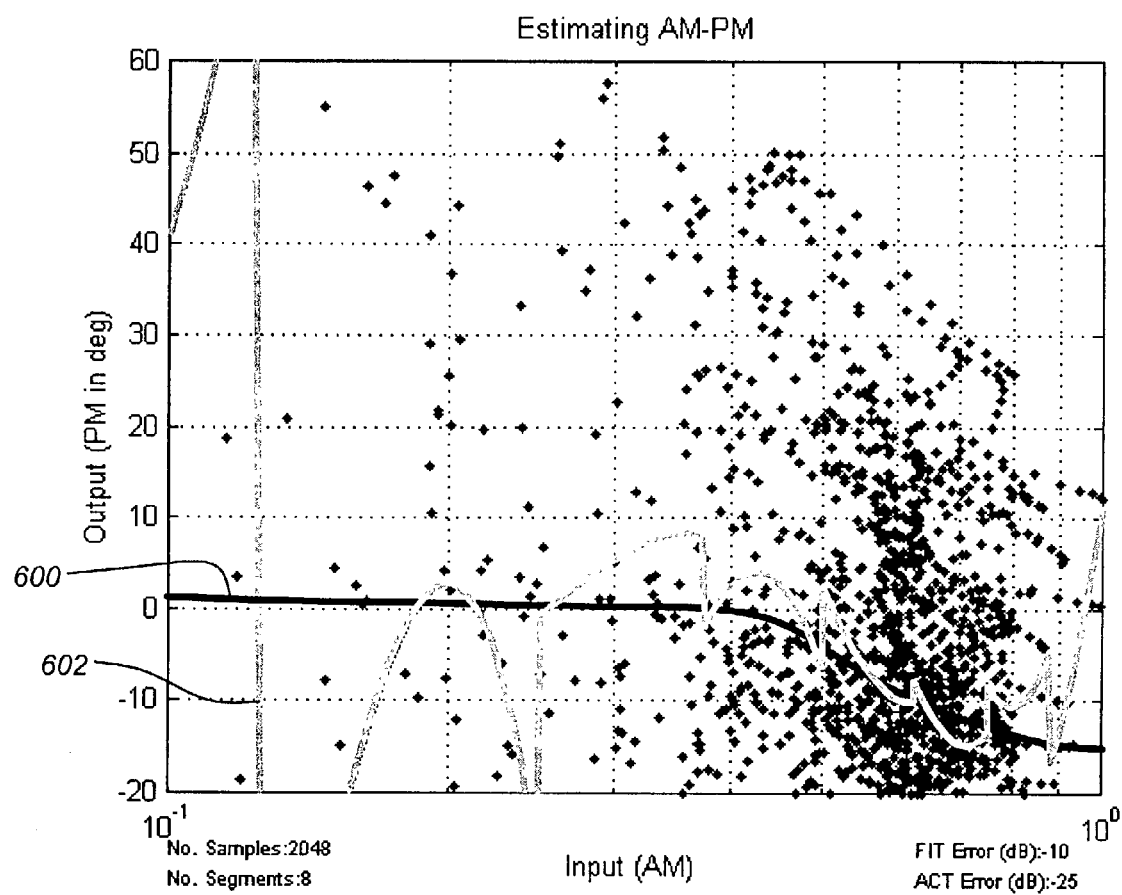
FIG. 6 is an AM-PM scattergram and curve fitting from a signal with 7 dB CNR.

FIGS. 5 and 6 show scattergrams for a signal with a carrier to noise ration (CNR) of approximately 7 dB. FIG. 5 presents AM-AM data and relevant curves. Curve 500 represents the true AM-AM characteristic of the amplifier as can be seen in FIG. 3, whereas curve 502 represents the fitting curve. The plot demonstrates that at low magnitudes the interpolated map deviates more from the actual amplifier response with a bias. This is due to the effect of a noise floor of the signal. In addition, less data is available for lower magnitudes, further degrading the fitting line. A similar result is seen in the AM-PM curve of FIG. 6 between the true amplifier phase response curve 600 (as in FIG. 4) and the interpolated curve 602. Since, most of the signal samples concentrate near amplifier saturation, the quality of the small-magnitude portion of the curve is not critical. Accuracy of the curves at lower magnitudes may be improved to reduce the bias, however, by either employing a larger antenna or extrapolating the curve to this region with a straight line slope as shown by the curve 504 in FIG. 5, recognizing the fact that amplifier amplitude is nearly linear and phase is nearly constant for small-magnitude signals.

Figure 7:
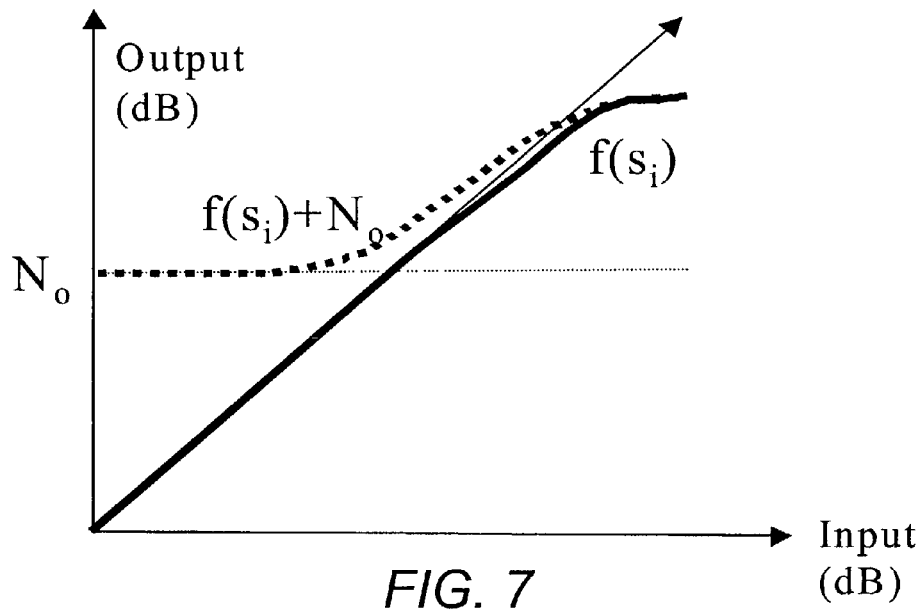
FIG. 7 depicts an general characteristic of an AM-AM map biased with noise.

FIG. 7 depicts an example AM-AM map biased with noise. $s_0=f(s_i)$ represents the true AM-AM curve without noise. $N_0$ is the downlink noise power and. $f(s_i)+N_0$ represents the AM-AM measurement with noise. Therefore, $\hat{f}(s_i)=(\hat{f}(\hat{s}_i)+N_0)-\hat{N}_0$, where symbol "^" represents an estimate. When $s_i$ is small, i.e. in the linear region of the amplifier, $f(s_i)=s_0 \cong S_i$ (ignoring a constant scale factor). $\hat{N}_0$ is estimated relative to the signal from the captured data. Similarly, for the AM-PM estimate the curve accuracy may be improved by the knowledge that the output phase is approximately constant when the input magnitude is small. In general, a known characteristic response of a performance characteristic to be actively mapped by the invention may be incorporated to refine the particular curve interpolation process.

Figure 8:
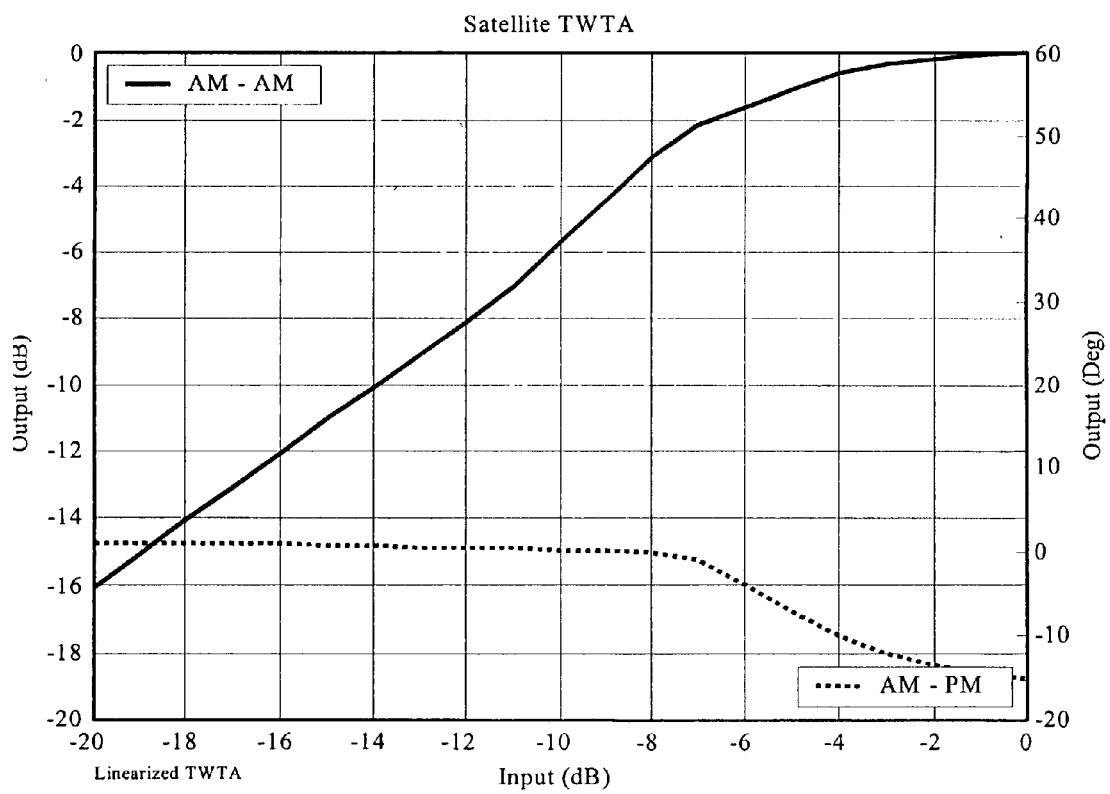
FIG. 8 is a first example of TWTA non-linearity for a linearized TWTA.
Figure 9:
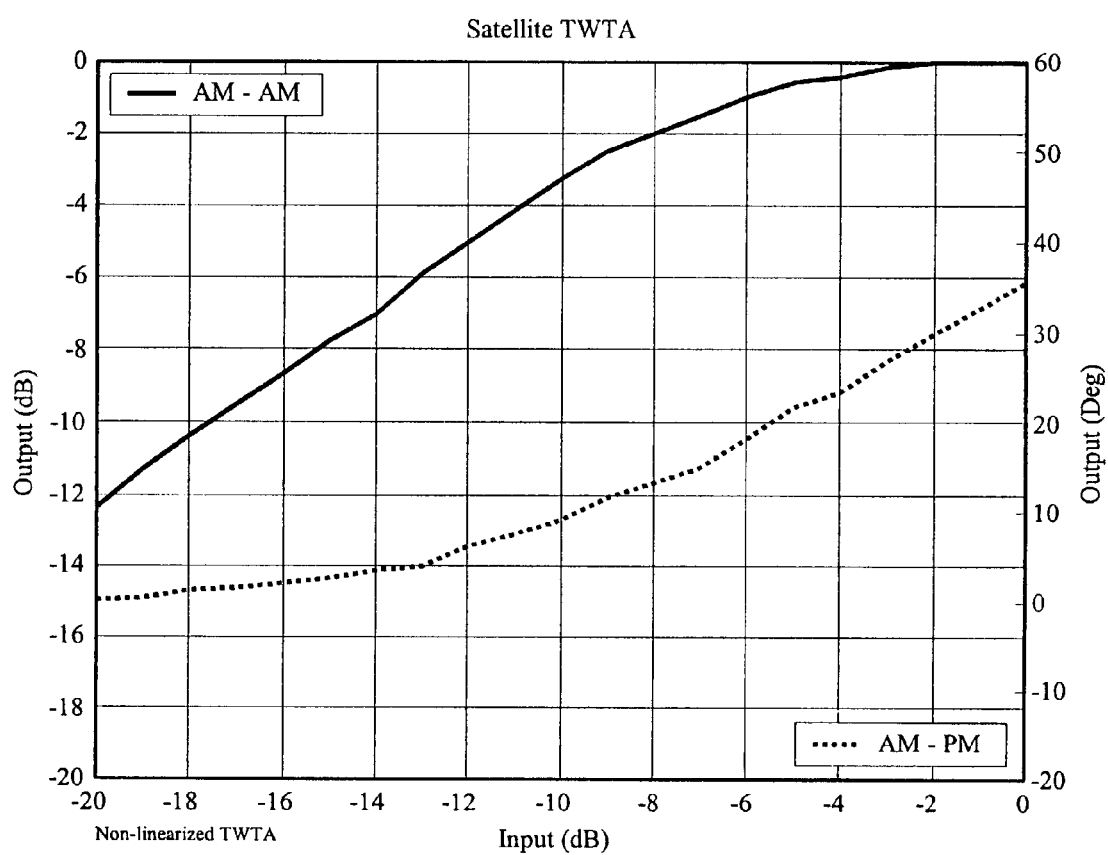
FIG. 9 is a second example of TWTA non-linearity for a non-linearized TWTA.

FIGS. 8 and 9 illustrate examples of two different TWTAs for the purpose of testing the invention. FIG. 8 illustrates a linearized TWTA and FIG. 9 illustrates a non-linearized TWTA. Other developed models may be similarly tested with the present invention. For example, A. Saleh has developed such TWTA models. See A. Saleh, "Frequency-Independent and Frequency-Dependent Nonlinear Models of TWTA Amplifiers," IEEE Transactions on Communications, vol. COM-29, No. 11, Nov. 1981, pp. 1715-1720 which is incorporated by reference herein.

Just as the known characteristic response of the TWTA may be incorporated into the curve fitting process, the impact of filtering in the overall system may also be accounted for by the interpolation process of the present invention. For a signal with a symbol rate of 20 MHz, the OMUX, which works on a signal at the output of the TWTA, may have a one-sided bandwidth much wider than 12 MHz. The receiver 116 may typically employ a front end filter (e.g. a low pass filter) with a bandwidth of approximately 17 MHz. The pulse-shaping filter at the receiver may have a bandwidth of 12 MHz. The receiver matched filter would be the most influential of the filters and its presence tends to degrade TWTA map measurement. In general, it is desirable to minimize filtering on the received signal in order to retain as much spectral re-growth effect of the TWTA non-linearity for best measurement accuracy. This is demonstrated in the following example.

Figure 10:
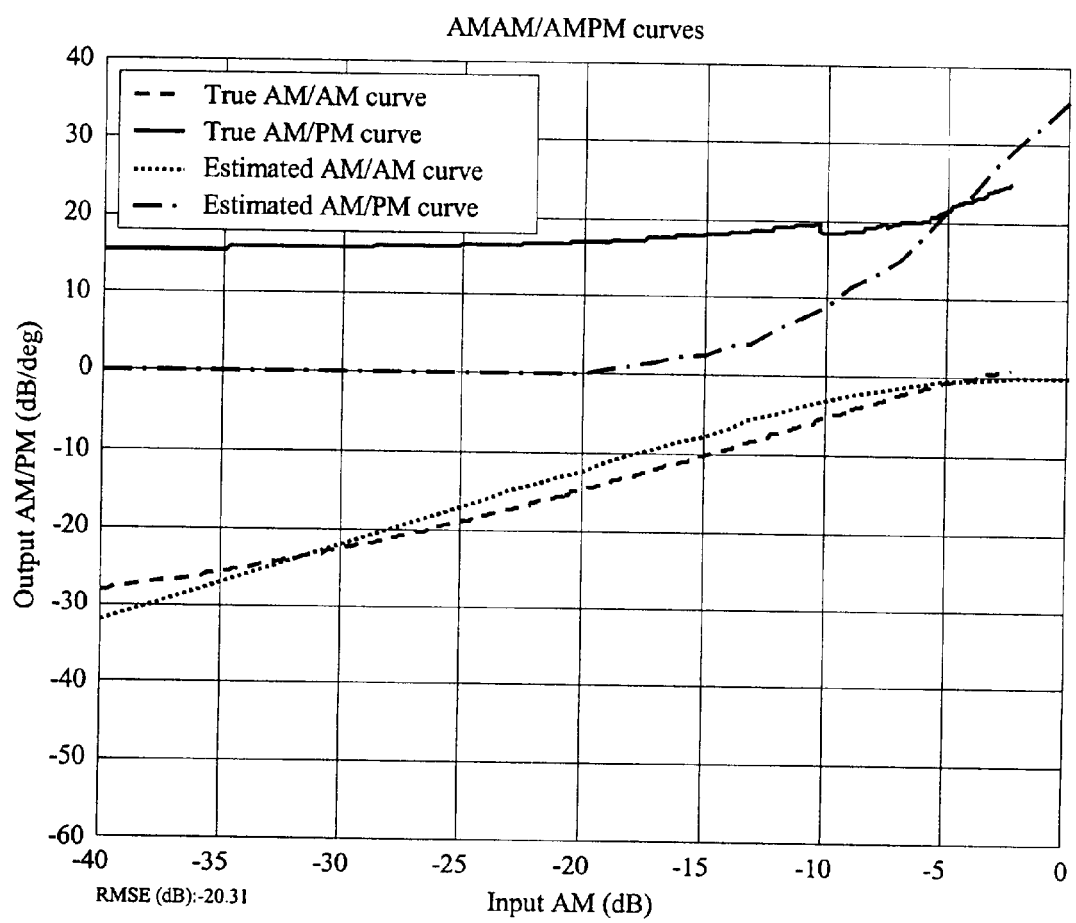
FIG. 10 is a simulated map showing true and fitting curves for a non-linearized TWTA with matched filtering.
Figure 11:
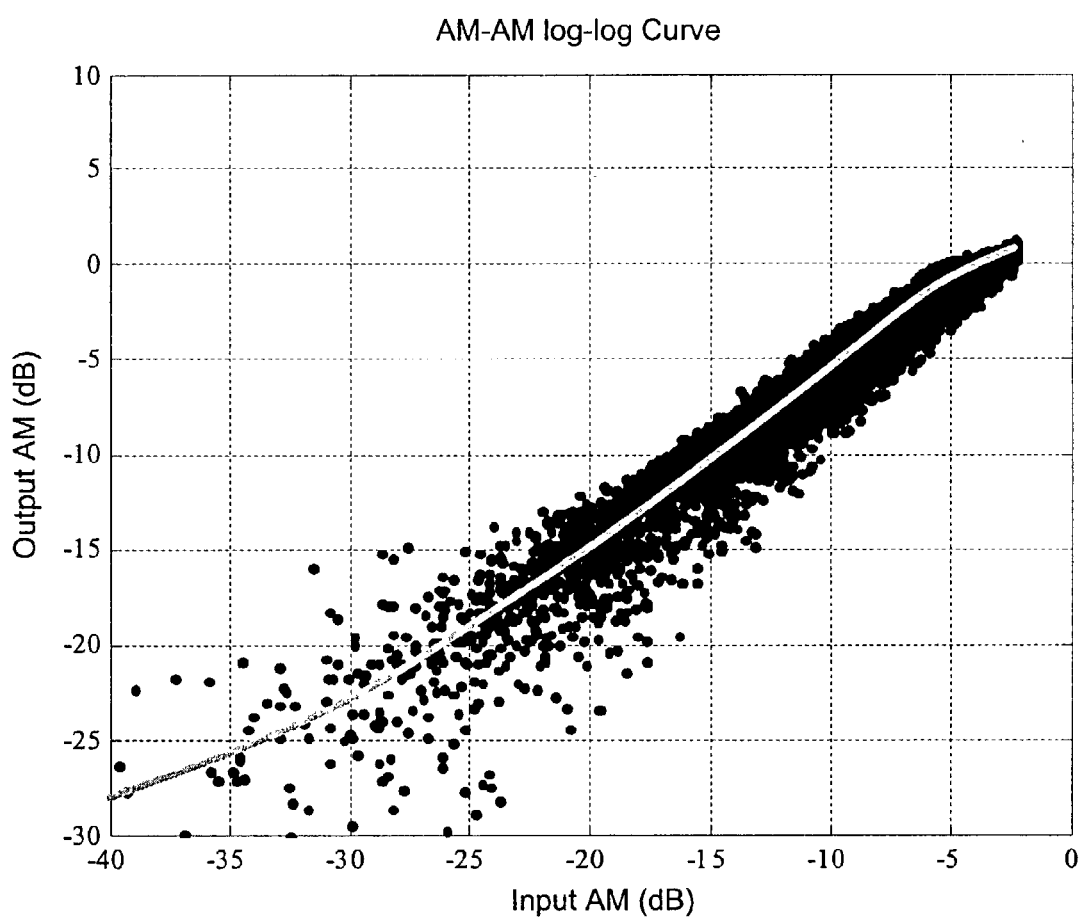
FIG. 11 is a graph of an estimated AM-AM curve with the raw data.
Figure 12:
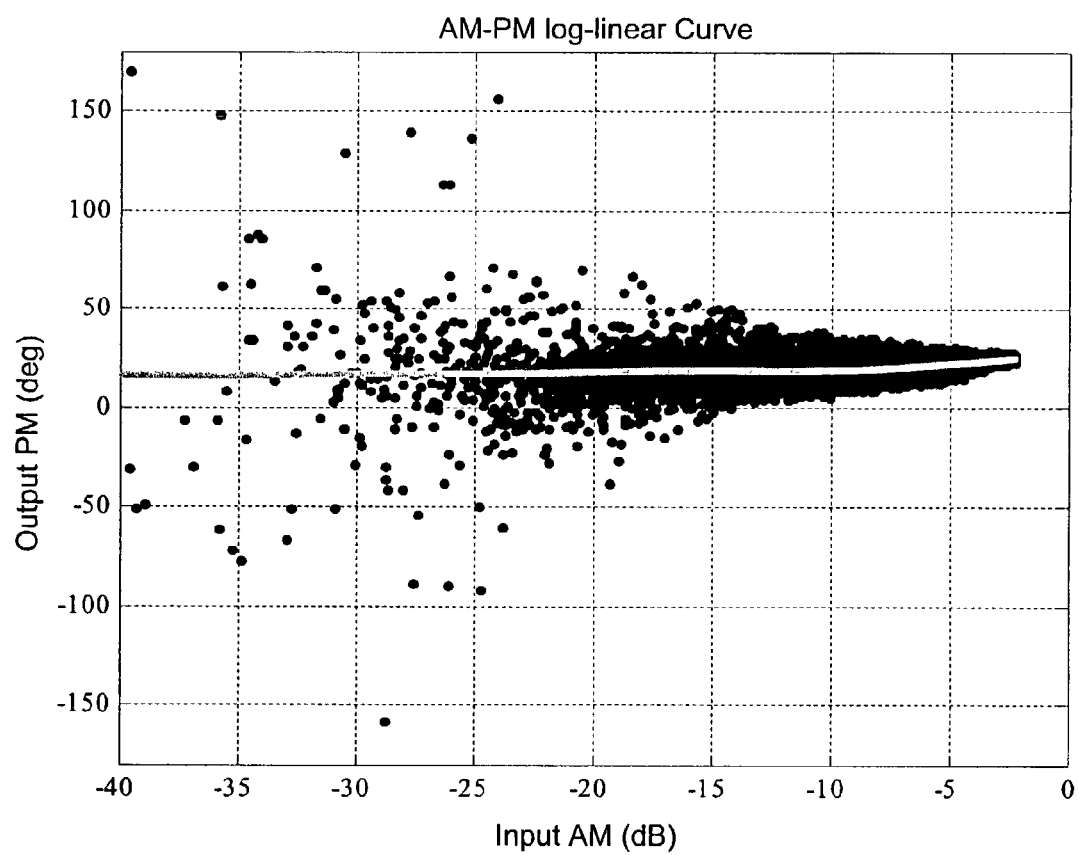
FIG. 12 is a graph of an estimated AM-PM curve with the raw data.
Figure 13:
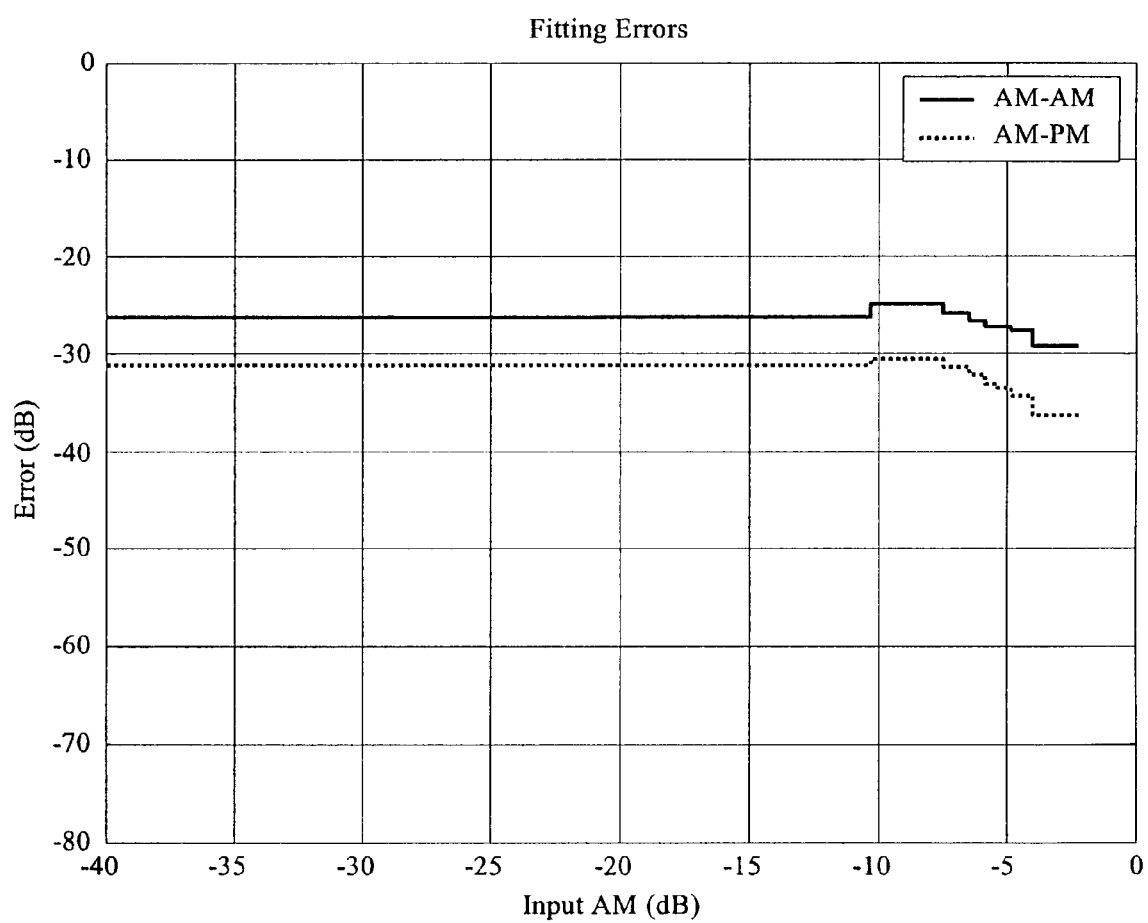
FIG. 13 is a graph of the curve fitting errors.
Figure 14:
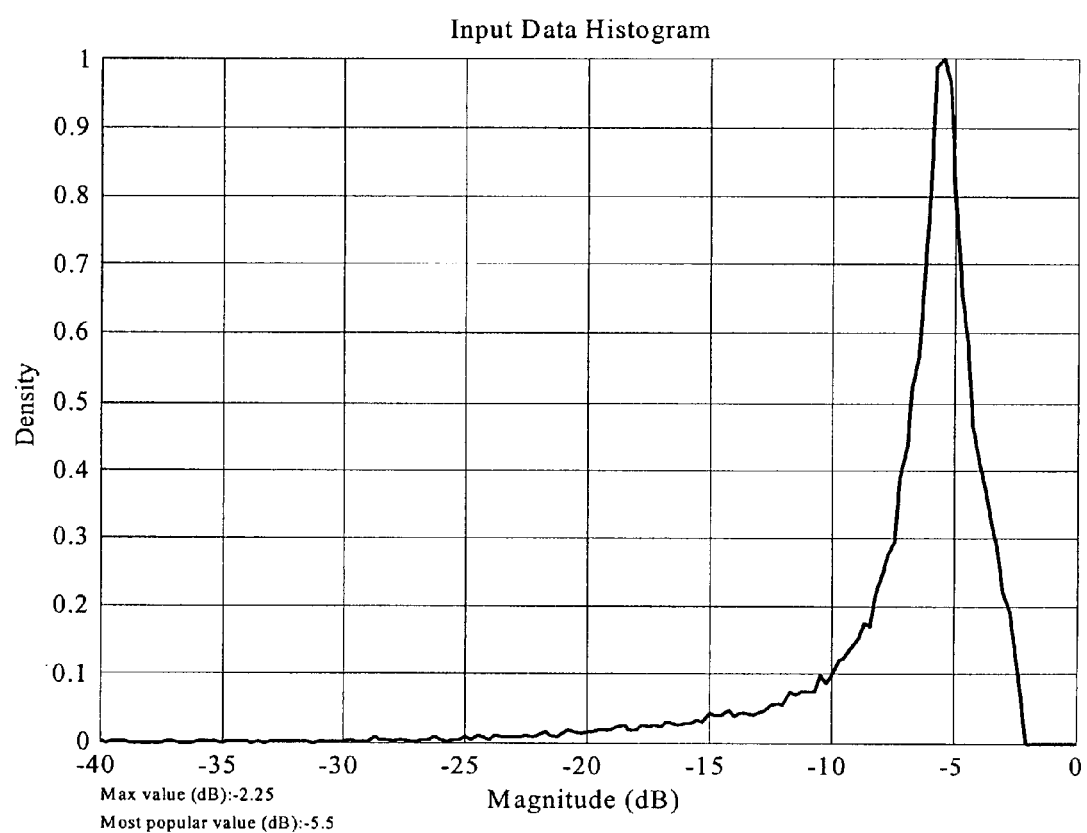
FIG. 14 is an input data histogram of the AM distribution.

FIGS. 10-14 show simulated maps of AM-AM and AM-PM curves and related information for a non-linearized TWTA. FIG. 10 is a simulated map showing true and fitting curves when the effect of the matched filter is included. The signal has a CNR of 99 dB and utilizes a non-linearized TWTA. Although the effects of the receiver filter and the OMUX have not been included, their influence is negligible. The fitting was performed using approximately 24K samples at 51 MHz sampling frequency in eight segments. (The data symbol rate is 20 MHz.) Notice that only a portion of the full non-linearity shows up in the measured data. FIGS. 11 and 12 show, respectively, the fitting AM-AM and AM-PM curves with the raw data. FIG. 13 shows the fitting error for the two curves. Incidentally, FIG. 14 is an input data histogram showing that most of the data occurs less than 10 dB from saturation.

Figure 15:
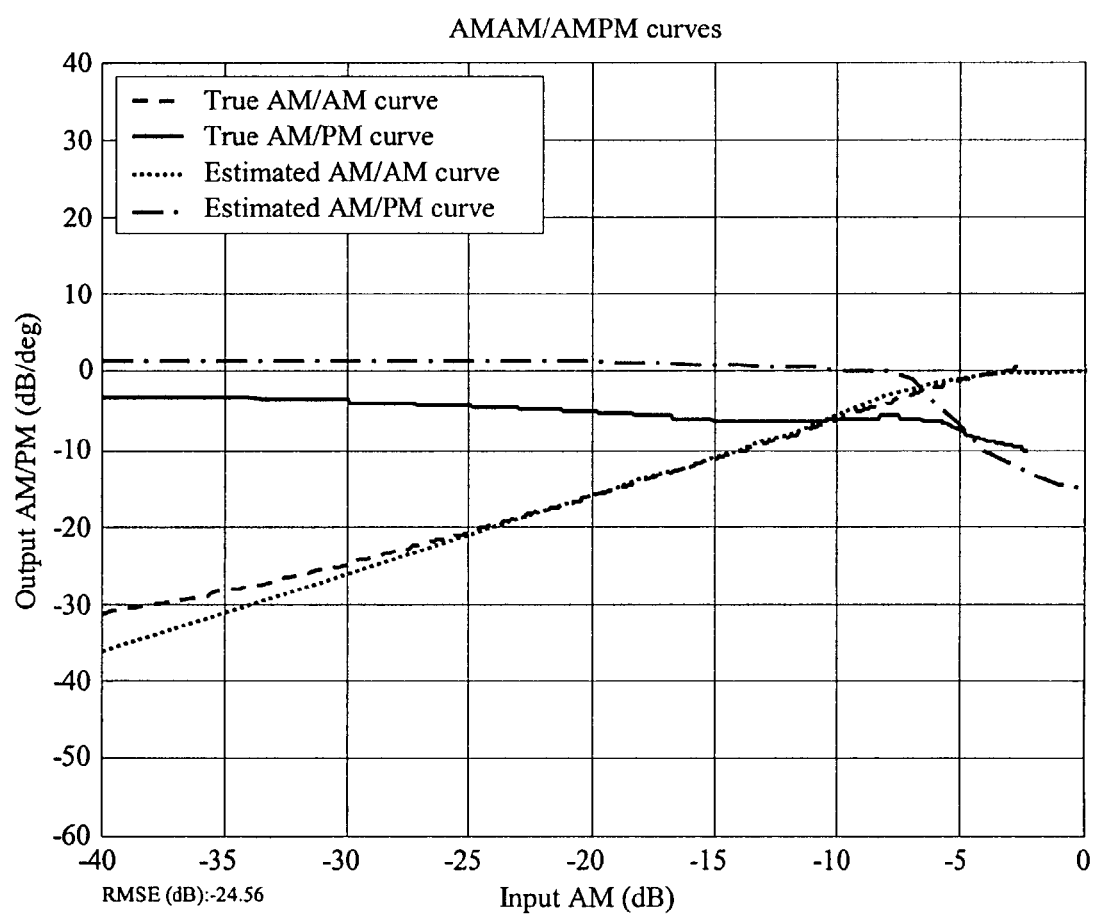
FIG. 15 is a simulated map showing true and fitting curves for a linearized TWTA with matched filtering.

FIG. 15 shows simulated maps of AM-AM and AM-PM curves for a linearized TWTA. The parameters are identical to those of the example of FIG. 10.

Figure 16:
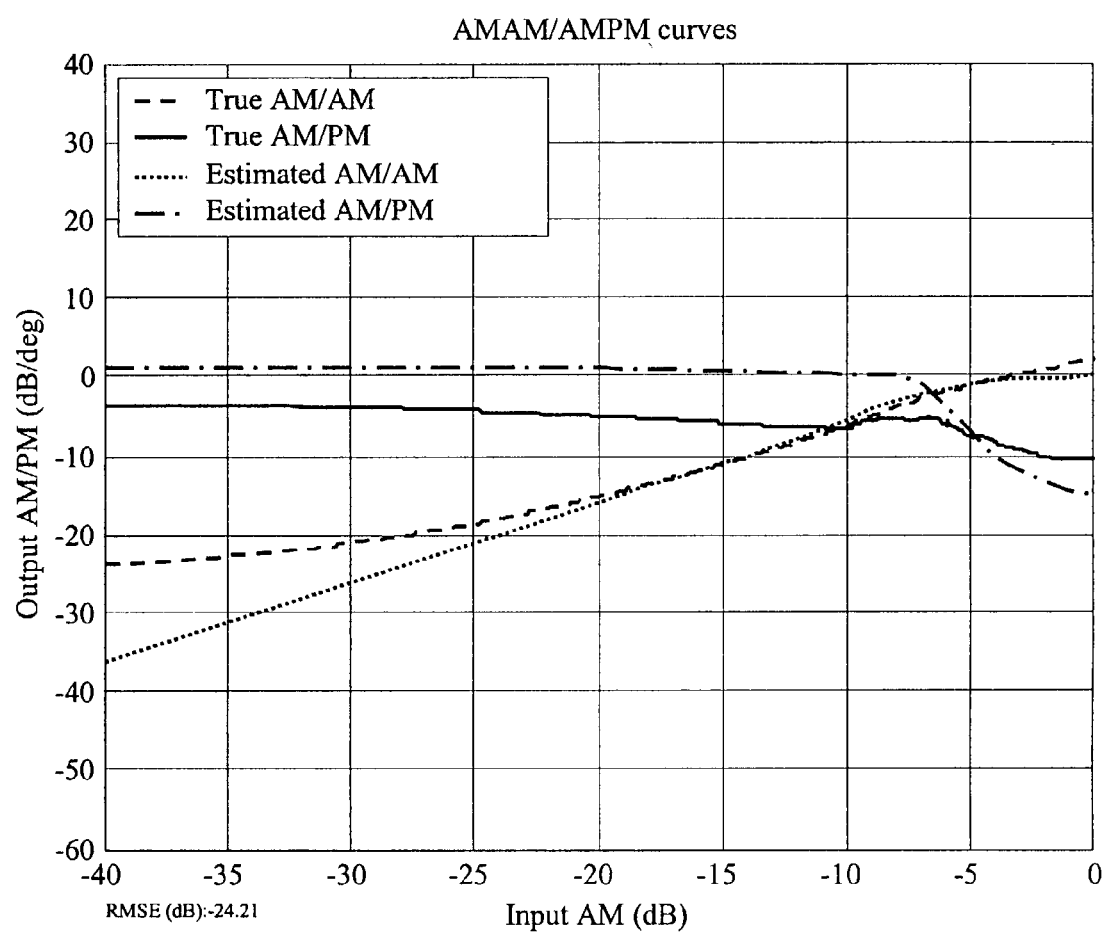
FIG. 16 is a simulated map showing true and fitting curves for a linearized TWTA with matched filtering with a reduced CNR.

FIG. 16 shows simulated maps of AM-AM and AM-PM curves for a linearized TWTA. In this case, the CNR is a practical 14.1 dB and a sampling rate of 50 MHz is used. The parameters are otherwise identical to those of the example of FIG. 10.

CONCLUSION

The foregoing description including the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A method of measuring a non-linear transmission performance characteristic, comprising the steps of:
   receiving a signal having a symbol stream;
   extracting the symbol stream from the received signal;
   generating an ideal signal from the extracted symbol stream;
   generating data points of a measured property of the generated ideal signal;
   generating data points of the measured property of the received signal corresponding to the data points of the measured property of the generated ideal signal;
   estimating the non-linear performance characteristic from a difference between the data points of the measured property of the generated ideal signal and the generated data points of the measured property of the received signal.

2. The method of claim 1, wherein the non-linear transmission performance characteristic is estimated from a difference between the ideal signal and the received signal after demodulation.

3. The method of claim 1, wherein the non-linear transmission performance characteristic is estimated from a difference between the ideal signal and the received signal before demodulation.

4. The method of claim 1, wherein the step of estimating the non-linear transmission performance characteristic includes fitting a curve of the received signal versus the generated ideal signal.

5. The method of claim 4, wherein the curve is an AM-AM plot.

6. The method of claim 4, wherein the curve is an AM-PM plot.

7. The method of claim 1, wherein the data points of a measured property of the received signal and the data points measured property of the generated ideal signal paired across a range.

8. The method of claim 7, wherein the measured property of the generated ideal signal is amplitude.

9. The method of claim 7, wherein the measured property of the received signal is amplitude.

10. The method of claim 7, wherein the measured property of the received signal is phase.

11. The method of claim 7, wherein the range is limited to signal power levels above a noise floor of the received signal.

12. The method of claim 7, wherein received signal is amplified and the range is limited to signal power levels below a saturation level of the amplified signal.

13. The method of claim 7, wherein the step of estimating the performance characteristic includes fitting a curve using the paired data points.

14. The method of claim 13, wherein fitting the curve comprises performing a minimum mean square operation across a range.

15. The method of claim 13, wherein fitting the curve incorporates a known characteristic response of the performance characteristic.

16. The method of claim 1, wherein the step of extracting the produces a symbol stream, a carrier frequency and symbol timing.

17. The method of claim 16, wherein the ideal signal is further generated from the carrier frequency and symbol timing.

18. The method of claim 17, wherein a pulse shaping filter is used with the symbol stream, carrier frequency and symbol timing to generate the generated ideal signal.

19. A system for measuring a non-linear transmission performance characteristic, comprising:
   a receiver for receiving a signal having a symbol stream and for extracting a received symbol stream from the received signal;
   a signal generator for producing an ideal signal from the extracted symbol stream; and
   a processor for generating data points of a measured property of the generated ideal signal, for generating data points of the measured property of the received signal corresponding to the data points of the measured property of the generated ideal signal, and for estimating the non-linear performance characteristic from a difference between the data points of the measured property of the generated ideal signal and the generated data points of the measured property of the received signal.

20. The system of claim 19, wherein the non-linear transmission performance characteristic is estimated from a difference between the ideal signal and the received signal after demodulation.

21. The system of claim 19, wherein the non-linear transmission performance characteristic is estimated from a difference between the ideal signal and the received signal before demodulation.

22. The system of claim 19, wherein estimating the non-linear transmission performance characteristic includes fitting a curve of the received signal versus the generated ideal signal.

23. The system of claim 22, wherein the curve is an AM-AM plot.

24. The system of claim 22, wherein the curve is an AM-PM plot.

25. The system of claim 19, wherein the data points of the measured property of the received signal and the data points of the measured property of the generated ideal signal axe paired across a range.

26. The system of claim 25, wherein the measured property of the generated ideal signal is amplitude.

27. The system of claim 25, wherein the measured property of the received signal is amplitude.

28. The system of claim 25, wherein the measured properly of the received signal is phase.

29. The system of claim 25, wherein the range is limited to signal power levels above a noise floor of the received signal.

30. The system of claim 25, wherein received signal is amplified and the range is limited to signal power levels below a saturation level of the amplified signal.

31. The system of claim 25, wherein estimating the performance characteristic includes fitting a curve using the paired data points.

32. The system of claim 31, wherein fitting the curve comprises performing a minimum mean square operation across the range.

33. The system of claim 31, wherein fitting the curve incorporates a known characteristic response of the performance characteristic.

34. The system of claim 19, wherein the receiver further produces a carrier frequency and symbol timing from the signal.

35. The system of claim 34, wherein the ideal signal is further generated from the carrier frequency and symbol timing.

36. The system of claim 35, wherein a pulse shaping filter is used with the symbol stream, carrier frequency and symbol timing to generate the generated ideal signal.

* * * * *